(12) United States Patent
Henninger et al.

(10) Patent No.: US 6,806,533 B2
(45) Date of Patent: Oct. 19, 2004

(54) SEMICONDUCTOR COMPONENT WITH AN INCREASED BREAKDOWN VOLTAGE IN THE EDGE AREA

(75) Inventors: Ralf Henninger, München (DE); Franz Hirler, Isen (DE); Joachim Krumrey, München (DE); Markus Zundel, Taufkirchen (DE); Walter Rieger, Arnoldstein (AT); Martin Pölzl, Ossiach (AT)

(73) Assignee: Infineon Technologies AG, Munich (DE)

( * ) Notice: Subject to any disclaimer, the term of this patent is extended or adjusted under 35 U.S.C. 154(b) by 20 days.

(21) Appl. No.: 10/402,872

(22) Filed: Mar. 28, 2003

(65) Prior Publication Data

US 2003/0209757 A1 Nov. 13, 2003

(30) Foreign Application Priority Data

Mar. 28, 2002 (DE) .......................................... 102 14 151

(51) Int. Cl.[7] .............................................. H01L 29/72
(52) U.S. Cl. ...................... 257/328; 257/330; 257/334; 257/337; 257/338
(58) Field of Search ................................. 257/328, 330, 257/334, 337, 338

(56) References Cited

U.S. PATENT DOCUMENTS

| 4,941,026 A | 7/1990 | Temple |
| 5,763,915 A | * 6/1998 | Hshieh et al. ............... 257/330 |
| 6,351,018 B1 | 2/2002 | Sapp |

FOREIGN PATENT DOCUMENTS

WO 00/51167 8/2000

* cited by examiner

*Primary Examiner*—Edward Wojciechowicz
(74) *Attorney, Agent, or Firm*—Laurence A. Greenberg; Werner H. Stemer; Ralph E. Locher

(57) ABSTRACT

A semiconductor component has a cell array formed in a semiconductor body with a number of identical transistor cells and at least one edge cell formed at an edge of the cell array. Each of the transistor cells has a control electrode, which is formed in a trench, and the edge cell has a field plate, which is formed in a trench, with a distance between the trench of the edge cell and the trench of the immediately adjacent transistor cell being less than the distance between a trench of a transistor cell and the trench of an immediately adjacent transistor cell in the cell array.

10 Claims, 4 Drawing Sheets

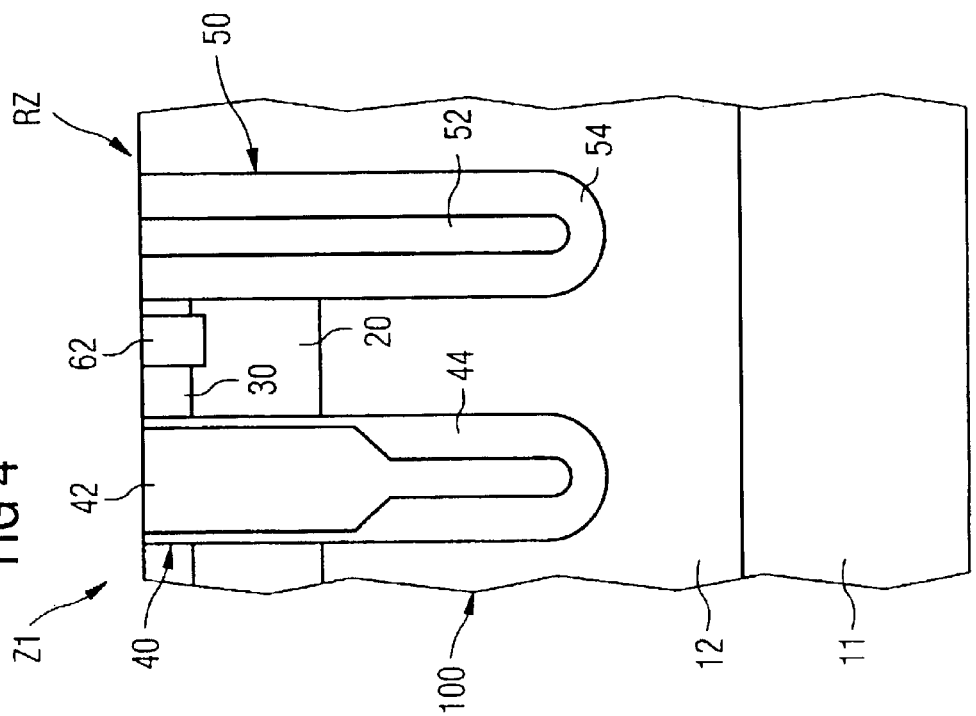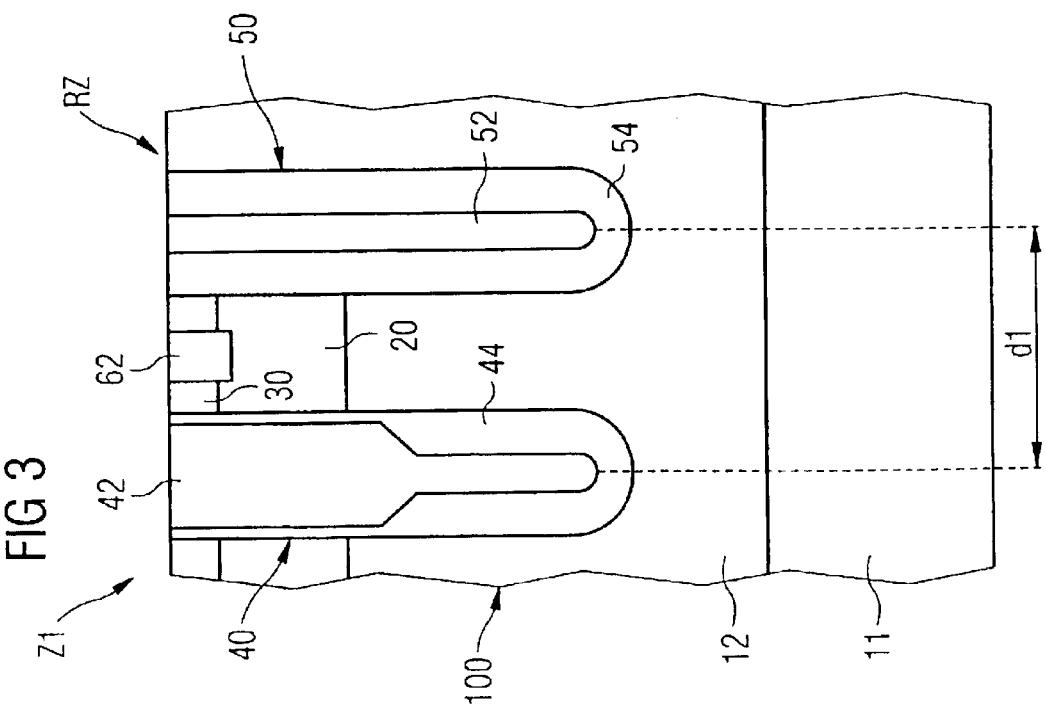

SEMICONDUCTOR COMPONENT WITH AN INCREASED BREAKDOWN VOLTAGE IN THE EDGE AREA

BACKGROUND OF THE INVENTION

Field of the Invention

The present invention relates to a semiconductor component having a cell array that is formed in a semiconductor body and has a number of identical transistor cells and at least one edge cell formed at the edge of the cell array. Each of the transistor cells has a first connection zone of a first conductivity type in the area of a rear face of the semiconductor body, a second connection zone of the first conductivity type in the area of a front face of the semiconductor body, a channel zone of a second conductivity type disposed between the first connection zone and the second connection zone, and at least one control electrode disposed in a trench which extends in the vertical direction into the semiconductor body. The control electrode is insulated from the semiconductor body by an insulation layer, with the trenches of the individual cells disposed at a distance from one another in a horizontal direction of the semiconductor body. The edge cell has a field plate disposed in a trench which extends in the vertical direction into the semiconductor body, and the field plate is insulated from the semiconductor body by an insulation layer.

Components such as these are also referred to as trench transistors.

Fundamental aspects relating to trench transistors are described in U.S. Pat. No. 4,941,026. International Patent Disclosure WO 00/51167, corresponding to U.S. Pat. No. 6,351,018, describes a trench transistor with an integrated Schottky diode, which is formed between two trenches, the distance between which is less than the distance between two trenches of the transistor cells.

A trench transistor with an edge cell is described in U.S. Pat. No. 5,763,915. The known component has a cell array with a large number of transistor cells, which each have a source zone, a body zone, and a gate electrode disposed in a vertical trench. A drain zone that is formed by the substrate of the semiconductor body is shared by the transistor cells. The cell array is bounded in the horizontal direction by an edge cell, which likewise has an electrode disposed in a trench.

SUMMARY OF THE INVENTION

It is accordingly an object of the invention to provide a semiconductor component with an increased breakdown voltage in the edge area with a structure for making electrical contact with electrodes of a trench transistor cell that overcomes the above-mentioned disadvantages of the prior art devices of this general type. The aim of the present invention is to provide a semiconductor component having a large number of identically formed transistor cells, which are disposed in a cell array, and has an edge cell, with the breakdown voltage in the area of the edge cell being higher than in the area of the cell array.

With the foregoing and other objects in view there is provided, in accordance with the invention, a semiconductor component. The semiconductor component contains a semiconductor body having a front face, a rear face, and trenches. The trenches are disposed at a distance from one another in a horizontal direction of the semiconductor body and extend in a vertical direction of the semiconductor body. A cell array is formed in the semiconductor body and has an edge area, a number of identically formed transistor cells, and at least one edge cell formed at the edge area of the cell array. Each of the transistor cells has a first connection zone of a first conductivity type disposed in an area of the rear face of the semiconductor body, a second connection zone of the first conductivity type disposed in an area of the front face of the semiconductor body, a channel zone of a second conductivity type disposed between the first connection zone and the second connection zone, at least one control electrode disposed in a respective one of the trenches extending in the vertical direction into the semiconductor body, and a first insulation layer insulating the control electrode from the semiconductor body. The edge cell includes a field plate disposed in another one of the trenches being an edge trench extending in the vertical direction into the semiconductor body, and a second insulation layer insulating the field plate from the semiconductor body. A first distance between the edge trench of the edge cell and the respective trench of an immediately adjacent one of the transistor cells being less than a second distance between the respective trench of the immediately adjacent one of the transistor cells and a further respective trench of a further immediately adjacent one of the transistor cells in the cell array.

The semiconductor component according to the invention has a cell array with a number of identically formed transistor cells, and has at least one edge cell, which is formed at the edge of the cell array, and which are formed in a semiconductor body. Each transistor cell has a first connection zone of a first conductivity type in the area of a front face of the semiconductor body, a second connection zone of a first conductivity type in the area of a rear face of the semiconductor body, a channel zone of a second conductance type disposed between the first connection zone and the second connection zone, and a control electrode disposed adjacent to the channel zone in a trench which extends in the vertical direction into the semiconductor body. The control electrode is insulated from the semiconductor body by an insulation layer. The trenches of the individual cells are disposed at a distance from one another in the horizontal direction of the semiconductor body. The edge cell has a field plate, which is disposed in a trench which extends in the vertical direction into the semiconductor body, and which edge cell is insulated from the semiconductor body by an insulation layer. In order to increase the breakdown voltage in the edge area, provision is made for the distance between the trench of the edge zone and the trench of the immediately adjacent transistor cell to be less than the distance between a trench of a transistor cell and the trench of an immediately adjacent transistor cell in the cell array.

In the case of MOS transistors, the first connection zone is referred to as the drain zone, the second connection zone as the source zone, the channel zone as the body zone and the control electrode as the gate electrode.

The concept according to the invention of making the distance between the trench of the edge cell and the trench of the immediately adjacent transistor cell less than the distance between the rest of the trenches in the cell array, the so-called pitch or pitch interval, is particularly suitable in conjunction with transistor cells in which the control electrodes taper in the vertical direction underneath the channel zone and the thickness of the insulation layer increases in a corresponding manner there. The control electrode is in this case used in the area of the channel zone/body zone as an electrode for forming a conductive channel when a drive potential is applied and, in the lower area, as a field plate for shielding the semiconductor area disposed between two trenches against high field strengths, with this resulting in an increased breakdown voltage in comparison to trench transistors without such field plates.

The transistor cells preferably each have a connection that is in each case disposed between two trenches and extends through the first connection zone into the channel zone. A connection between the trench of the edge cell and the immediately adjacent transistor cell is in one embodiment formed symmetrically between the trenches of the edge cell and of this transistor cell, and in a further embodiment is disposed closer to the trench of the edge cell than to the trench of the transistor cell.

A further embodiment provides for an area to be provided in the cell array in order to produce integrated components that have their connections in the area of the front face of the semiconductor body, in which case the breakdown voltage in this area must not be less than the breakdown voltage of the transistor cells. For this purpose, the distance between two trenches in the cell array on a side that faces away from the respectively associated cell is less than the distance between the trenches of two immediately adjacent transistor cells in the cell array, in order to form a "protected area" for the integration of low-voltage components between these closely adjacent trenches.

The semiconductor component has a number of transistor cells in a cell array and an area such as this formed in the cell array between two closely adjacent trenches. In which area a semiconductor component is integrated, whose connections are located in the area of the front face of the semiconductor body. The further semiconductor component is, in particular, a bipolar transistor, an MOS transistor or a diode. Multiple wells may be provided in the area between the trenches in order to form the component, with at least one doped well being disposed in another doped well.

Other features which are considered as characteristic for the invention are set forth in the appended claims.

Although the invention is illustrated and described herein as embodied in a semiconductor component with an increased breakdown voltage in the edge area, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a sectional view of a first embodiment of an edge area of the semiconductor component according to the invention;

FIG. 4 is a sectional view of a second embodiment of the edge area of the semiconductor component according to the invention.

DESCRIPTION OF THE PREFERRED EMBODIMENTS

Figure 1:
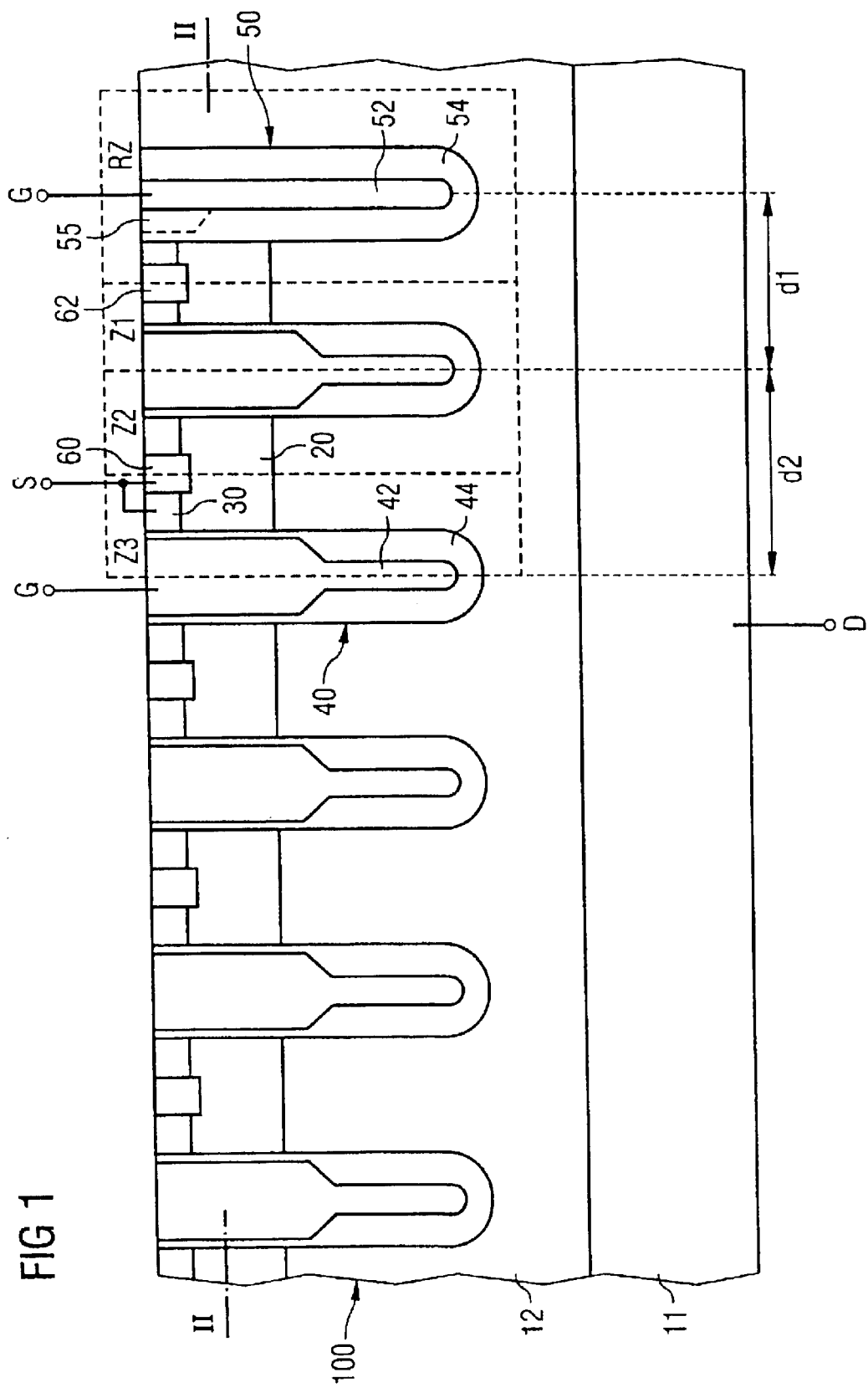
FIG. 1 is a diagrammatic, cross-sectional side view of an exemplary embodiment of a semiconductor component according to the invention.

In all the figures of the drawing, sub-features and integral parts that correspond to one another bear the same reference symbol in each case unless stated to the contrary. Referring now to the figures of the drawing in detail and first, particularly, to FIG. 1 thereof, there is shown a cross-sectional side view of a semiconductor component according to the invention. FIG. 2 shows a view from above taken along the section plane II—II shown in FIG. 1.

The semiconductor component according to the invention has a cell array with a large number of identically formed transistor cells Z1, Z2, Z3 and at least one edge cell RZ disposed at the edge of the cell array. Only three of the transistor cells are provided with reference symbols in FIG. 1, namely the transistor cells Z1, Z2, Z3.

In the illustrated exemplary embodiment, the semiconductor component has a first connection zone with a heavily doped zone 11 and a more lightly doped zone 12. Heavily doped zones 30 of a first conductivity type are provided in an area of a front face of a semiconductor body 100, underneath which a zone 20 of a second conductivity type, which is complementary to the first conductivity type, is disposed.

The more heavily doped zone 11 is used as a common drain zone for all the transistor cells Z1, Z2, Z3. The heavily doped zones 30, which are disposed in the area of the front face, of the first conductivity type form the source zones, the zones 20, which are disposed underneath the source zones 30, of the second conductivity type form a body zone of the transistor cells, and the more lightly doped zone 12 is used as the drift zone of the transistor cells Z1, Z2, Z3.

The heavily doped zone 12 may be in the form of a semiconductor substrate to which an epitaxial layer is applied, in which the drift zone 12, the body zones 20 and the source zones 30 are formed. The semiconductor body 100 may also be in the form of a more lightly doped substrate, into which the heavily doped drain zone 11, the body zones 20 and the source zones 30 are incorporated by suitable methods, for example ion implantation.

The drain zone 11, the source zone 30 and the drift zone 12 are n-doped in the case of an n-channel MOS transistor, and are p-doped in the case of a p-channel MOS transistor. The body zone 20 is in each case doped in a complementary manner.

Each transistor cell Z1, Z2, Z3 has a gate electrode 42, which is disposed in a trench 40 which, starting from the front face, extends in the vertical direction into the semiconductor body 100. The gate electrode 42 is isolated by an insulation layer 44 from the semiconductor body 100, that is to say from the source zone 30, the body zone 20 and the drift zone 12, and in the exemplary embodiment is formed in such a way that it tapers in the area underneath the body zone 20, and in such a way that the thickness of the insulation layer 44 increases in this area. The gate electrode 42 is used in this area underneath the body zone 20 as a field plate for shielding the body zone 20 against high electrical field strengths. In the area of the body zone 20, the gate electrode 42 is used to form an electrically conductive channel between the source zone 30 and the drift zone 12 when a drive potential is applied.

However, the invention is not restricted to the use of only one electrode in the trench. It is thus possible, in a manner which will not be described in any greater detail but is well known, for a number of electrodes (which are connected to a common potential or to a potential which is not common) also to be provided in addition to the gate electrode in the trench.

Figure 2:
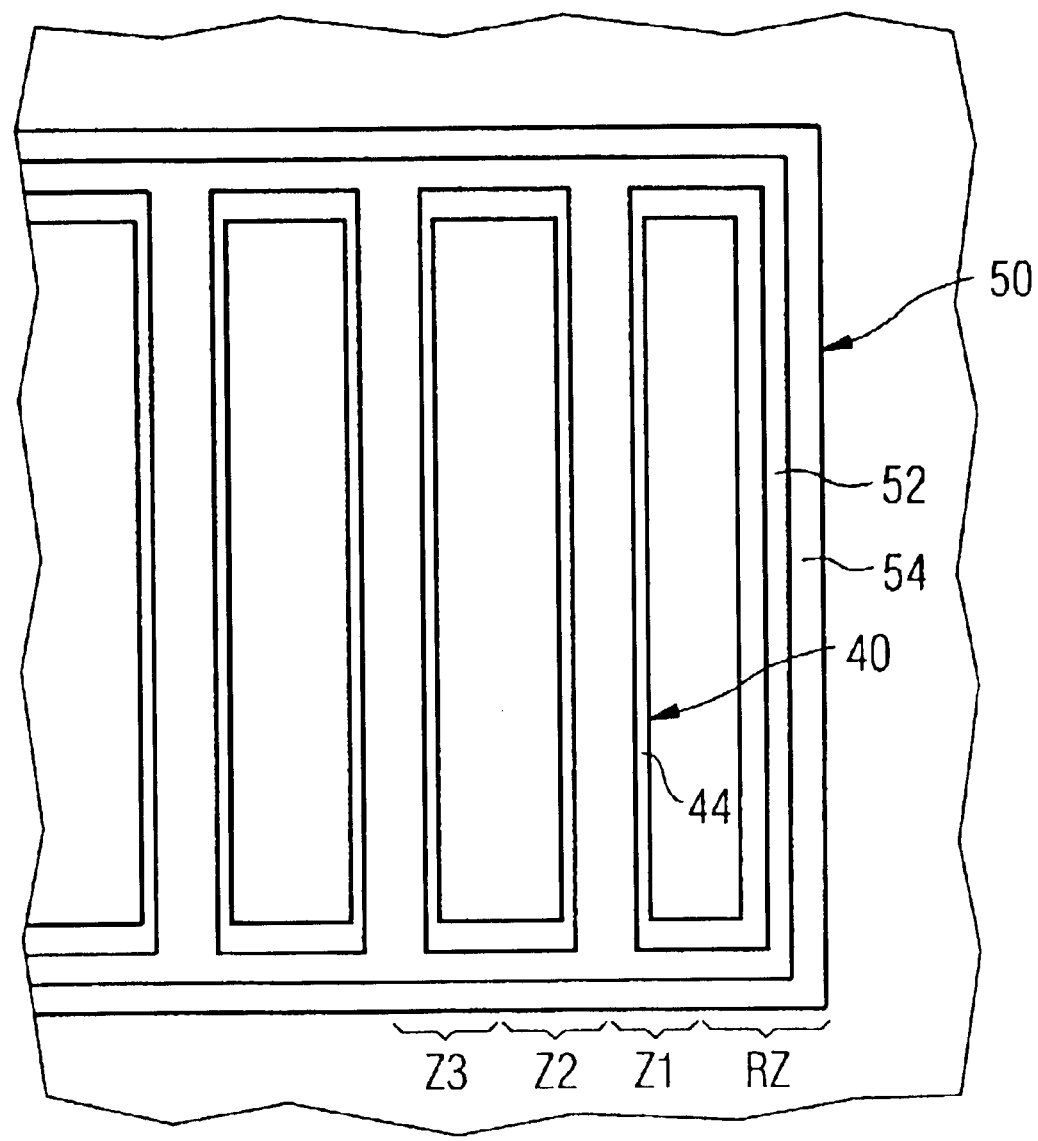
FIG. 2 is a cross-sectional view of the semiconductor component according to the invention, taken from above along the section plane II—II shown in FIG. 1.

In the exemplary embodiment illustrated in FIG. 1, the gate electrode 42 is used as a gate electrode for in each case two transistor cells, which extend to the left and right from the trench 40 in a horizontal direction. By way of example, in FIG. 1, one gate electrode that is disposed in one trench is shared by the transistor cells Z1, Z2. Furthermore, one body zone 20 is in each case shared by two transistor cells, namely the body zone 20 disposed between two of the trenches 40. Thus, in the example shown in FIG. 1, the transistor cells Z2 and Z3 share one body zone 20, which is disposed between their gate electrodes 42. It should be mentioned that, in the literature, only a structure that corresponds to a cell in the sense of this application is sometimes also referred to as a half cell.

The trenches 40 with the gate electrodes 42 of two immediately adjacent cells Z2, Z3 are spaced apart by a distance (pitch) d2 in the area of the cell array. For the purposes of this description, the expression immediately adjacent refers to transistor cells that have a common body zone.

The cell array with the transistor cells Z1, Z2, Z3 is bounded by the edge cell RZ, with the edge cell RZ having a field plate 52 which is disposed in a trench 50 that extends in the vertical direction into the semiconductor body 100, with the field plate 52 being isolated from the semiconductor body 100 by an insulation layer 54. The thickness of the insulation layer 54 corresponds approximately to the thickness of the insulation layer 44 around the field plate section of the gate electrodes 42 in the lower area of the trenches 40. However, the field plate 52 may be configured to be broader in the upper area on the side facing the cell array than in the other areas, as is illustrated by dashed lines in FIG. 1. This broader area 55 may extend downward into the drift zone 12.

The distance between the trench 50 of the edge cell RZ and the trench 40 of the immediately adjacent transistor cell Z1 is less than the normal distance d2 between immediately adjacent transistor cells Z2, Z3 in the cell array. Therefore, the breakdown voltage of the component in the area of the edge cell RZ is higher than in the area of the cell array. The breakdown voltage denotes a voltage applied between the drain connection D and the source connection S at which a current flow occurs, when the gate electrode 42 is not being driven, as a result of an avalanche-like breakdown. The increased breakdown voltage in the edge area in comparison to that in the cell array results in that a voltage breakdown occurs first of all in the cell array when a reverse voltage is applied, so that the breakdown current which results from this is distributed over the area of the cell array, which is larger than the area of the edge cell RZ.

As can be seen in particular in FIG. 2, the trench 50 together with the field plate 52 surrounds the cell array in an annular shape, with the field plate 52 being short-circuited to the gate electrodes 42 in the example.

Connections 60, which, starting from the front face of the semiconductor body 100, extend through the source zone 30 into the body zone 20 are provided in order to make contact with the source zone 30 and in order to short-circuit the source zone 30 and the body zone 20. These connections 60 are composed, for example, of a metal or else of polysilicon.

For clarity reasons, the source connections S, the gate connections G and the drain connection D are shown only schematically. The wiring levels above the semiconductor body are not shown. The gate electrodes 42 are in this case all connected to a common gate potential, and the source zones 30 are connected to a common source potential via the connections 60. The field plate 52 of the edge cell RZ is preferably connected to the gate potential or to the common gate connection.

A connection 62 of the transistor cell Z1 which is disposed immediately adjacent to the edge cell RZ is in one embodiment of the invention disposed symmetrically between the trench 50 of the edge cell RZ and the trench 40 of the transistor cell Z1, as is illustrated in FIG. 3, with FIG. 3 showing an enlarged detail of the semiconductor component in the edge area.

In a further embodiment, which is illustrated in FIG. 4, provision is made for the connection 62 between the trench 50 of the edge cell RZ and the immediately adjacent transistor cell Z1 to be disposed closer to the edge cell, or to its trench 50. This assists process reliability during the production of the trench, in which the connection 62 is disposed. When producing a low-impedance contact between the connection (which is composed, for example of a metal or a polysilicon), so-called contact implantation is normally carried out before the deposition of the contact material, during which the side walls of the trench are highly doped, with the dopant type in the area of the source zone corresponding to that of the source zone, and the dopant type in the area of the body zone corresponding to that of the body zone. As the distance between the connection trench and the gate electrode 42 increases, the confidence rises that no dopants will enter the area in which a conductive channel is formed when the gate electrode 42 is driven such that it conducts. These dopants would have a negative influence on the channel.

Figure 5:
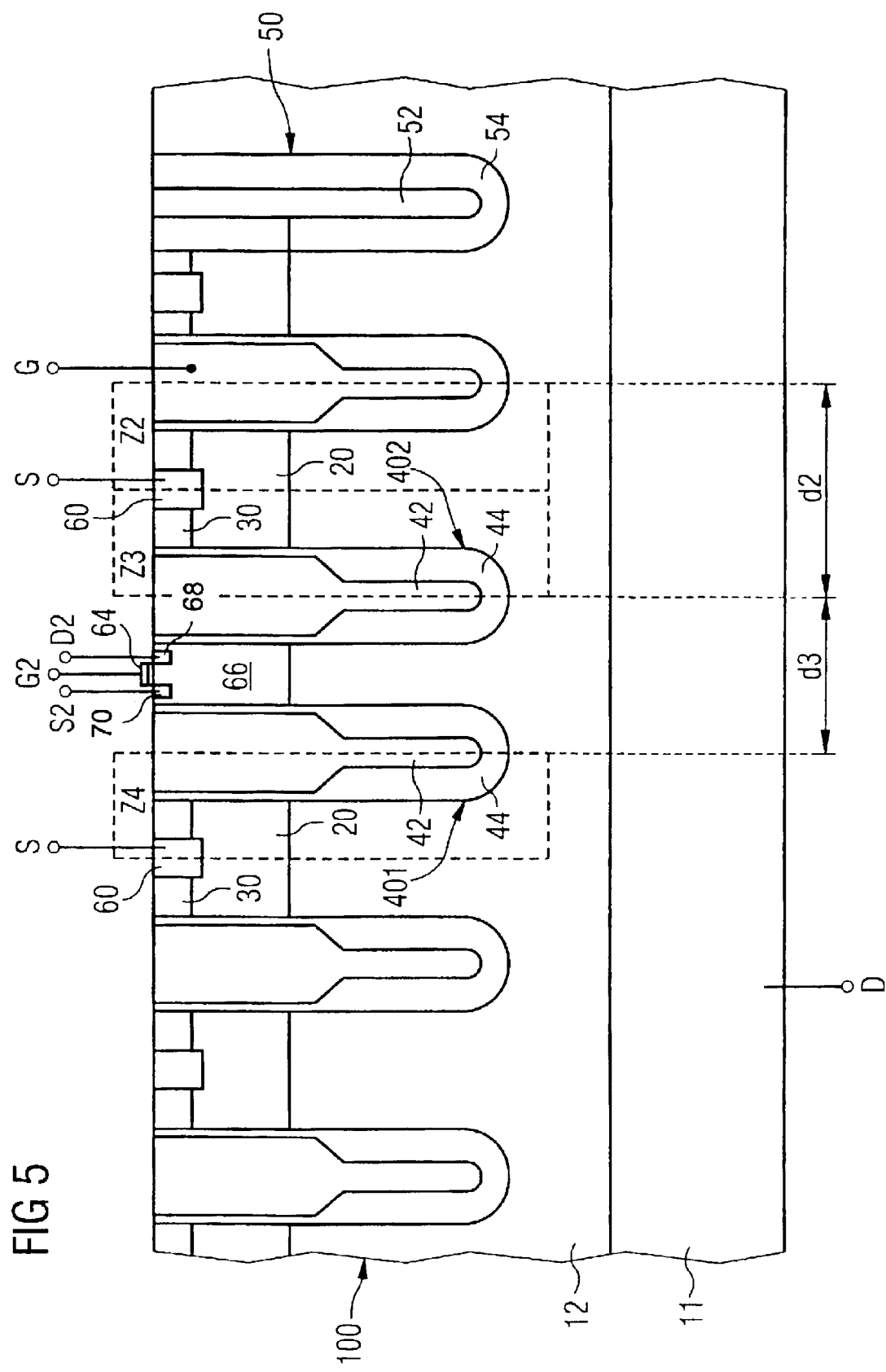
FIG. 5 is a cross-sectional view through a further embodiment of the semiconductor component according to the invention, with two closely adjacent trenches.

FIG. 5 shows a further exemplary embodiment of the semiconductor component according to the invention, in which a distance d3 between two trenches 401, 402 in the cell array is also less than the distance d2 between the trenches of two immediately adjacent transistor cells Z2, Z3. The two trenches 401, 402, which are disposed adjacent, with the control electrodes 42 disposed in them are in each case a component of a transistor cell, namely of the transistor cells Z3, Z4 in FIG. 5. In the area that in each case faces away from the transistor cells Z3, Z4 between the trenches 401, 402, an integrated component is formed in the area of the front face of the semiconductor body 100, and its connections are located in the area of the front face of the semiconductor body 100. By way of example, in FIG. 5, the semiconductor component is in the form of a lateral MOS transistor, which has a drain zone 68, a source zone 70 that is disposed at a horizontal distance from the drain zone 68, and a gate electrode 64 that is disposed above the front face 100 of the semiconductor body. The drain zone 68 and the source zone 70 are embedded in a zone 66 which is doped in a complementary manner and is formed, by way of example, in a corresponding manner to the body zones 20 of the transistor cells Z2, Z3, Z4. If a lateral MOS transistor of a complementary conductivity type is intended to be provided, then there is no need for the doped zone 66, and the drain zone 68 and the source zone 70 need to be used to in a correspondingly complementary manner.

Any desired further lateral components, such as bipolar transistors, diodes, CMOS components and the like can, of course, be provided in the zone between the two trenches.

The gate electrodes 42 with the field plates in the trenches 401, 402 which are relatively close together protect the semiconductor component which is disposed between the trenches in the area of the front face of the semiconductor body 100 against high field strengths, and ensure that the breakdown voltage in this area is not less than in the area of the transistor cells Z1, Z2, Z3, Z4. In the illustrated exemplary embodiment, a pn junction is formed between the drift zone 12 and the zone 66 which is doped in a complementary manner to it, which pn junction is reverse-biased in the drain-source direction in the case of an n-channel MOS transistor, so that no charge carriers, which would interfere with the operation of the lateral MOS transistor, are injected into the zone 66 during normal operation of the semiconductor component. The trenches which are disposed with the shorter distance d3 between them ensure, together with the control electrodes 42, that the pn junction does not break down at lower breakdown voltages than the transistor cells Z1, Z2, Z3, Z4.

Any desired further edge structures may, of course, be used in the semiconductor component shown in FIG. 5.

We claim:

1. A semiconductor component, comprising:
    a semiconductor body having a front face, a rear face, and trenches formed therein, said trenches disposed at a distance from one another in a horizontal direction of said semiconductor body and extend in a vertical direction of said semiconductor body; and
    a cell array formed in said semiconductor body and having an edge area, a number of identically formed transistor cells, and at least one edge cell formed at said edge area of said cell array, each of said transistor cells having:
        a first connection zone of a first conductivity type disposed in an area of said rear face of said semiconductor body;
        a second connection zone of said first conductivity type disposed in an area of said front face of said semiconductor body;
        a channel zone of a second conductivity type disposed between said first connection zone and said second connection zone;
        at least one control electrode disposed in a respective one of said trenches extending in the vertical direction into said semiconductor body; and
        a first insulation layer insulating said control electrode from said semiconductor body;
    said edge cell including:
        a field plate disposed in another one of said trenches being an edge trench extending in the vertical direction into said semiconductor body; and
        a second insulation layer insulating said field plate from said semiconductor body, a first distance between said edge trench of said edge cell and said respective trench of an immediately adjacent one of said transistor cells being less than a second distance between said respective trench of said immediately adjacent one of said transistor cells and a further respective trench of a further immediately adjacent one of said transistor cells in said cell array.

2. The semiconductor component according to claim 1, further comprising connections each disposed between two of said trenches and each extending through said second connection zone into said channel zone.

3. The semiconductor component according to claim 2, wherein a respective connection disposed between said edge trench of said edge cell and said respective trench of said immediately adjacent one of said transistors cells is formed symmetrically between said edge trench and said respective trench.

4. The semiconductor component according to claim 2, wherein a respective connection between said edge trench of said edge cell and said respective trench of said immediately adjacent one of said transistors cell is disposed closer to said edge trench of said edge cell than to said further trench.

5. The semiconductor component according to claim 1, wherein said control electrode of each of said transistor cells tapers in the vertical direction underneath said channel zone, and said first insulation layer has a thickness increasing in an area underneath said channel zone.

6. The semiconductor component according to claim 1, wherein a third distance between at least two of said trenches in said cell array on a side facing away from a respectively associated transistor cell is less than the second distance between said trenches of two immediately adjacent ones of said transistor cells in said cell array.

7. The semiconductor component according to claim 6, further comprising a component having connections disposed in an area of said front face of said semiconductor body integrated between two of said trenches that are closer together.

8. The semiconductor component according to claim 7, wherein said component is a transistor selected from the group consisting of horizontal bipolar transistors and horizontal MOS transistors.

9. A semiconductor component, comprising:
    a semiconductor body having a front face, a rear face, and trenches formed therein extending in a vertical direction in said semiconductor body;
    a cell array formed in said semiconductor body and having a number of identically formed transistor cells, each of said transistor cells including:
        a first connection zone of a first conductivity type disposed in an area of said rear face of said semiconductor body;
        a second connection zone of said first conductivity type disposed in an area of said front face of said semiconductor body;
        a channel zone of a second conductivity type disposed between said first connection zone and said second connection zone;
        a control electrode disposed in one of said trenches; and
        an insulation layer insulating said control electrode from said semiconductor body, said trenches of said transistor cells disposed at a distance from one another in a horizontal direction of said semiconductor body;
        a first distance between at least two of said trenches in said cell array on a side facing away from respectively associated cell is less than a second distance between said trenches of two immediately adjacent ones of said transistor cells in said cell array; and
    a component having connections disposed in an area of said front face of said semiconductor body between said two trenches being closer together.

10. The semiconductor component according to claim 9, wherein said control electrode of each of said transistor cells tapers in the vertical direction underneath said channel zone, and said insulation layer has a thickness increasing in an area underneath said channel zone.

* * * * *